United States Patent [19]

White et al.

[11] Patent Number: 4,809,290
[45] Date of Patent: Feb. 28, 1989

[54] OPTO-ELECTRONIC DIRECTIONAL SWITCH

[75] Inventors: Ian H. White; Richard S. Linton; John E. Carroll, all of Cambridge, England

[73] Assignee: British Telecommunications public limited company, Great Britain

[21] Appl. No.: 24,129

[22] Filed: Mar. 10, 1987

[30] Foreign Application Priority Data

Mar. 10, 1986 [GB] United Kingdom ............... 8605862

[51] Int. Cl.$^4$ ........................... H01S 3/19; H01S 3/10
[52] U.S. Cl. ......................................... 372/44; 372/25; 372/29; 372/45; 372/50; 372/97; 372/108
[58] Field of Search ....................... 372/43, 44, 45, 46, 372/50, 23, 25, 29, 97, 30, 108

[56] References Cited

U.S. PATENT DOCUMENTS 4,210,803  7/1980  Ih ......................................... 372/50
4,219,785  8/1980  Scifres et al. ........................ 372/44

Primary Examiner—William L. Sikes
Assistant Examiner—Georgia Y. Epps
Attorney, Agent, or Firm—Nixon & Vanderhye

[57] ABSTRACT

An opto-electronic switch which shows a good signal rejection ratio between modes is also of particularly small dimensions. The switch comprises a semiconductor laser 1 having four contacts 12, 12', 13, 13' which provide gain guiding under two stripe windows 18, 19. By varying the bias currents supplied to the individual contacts 12, 12', 13, 13', or inputting optical control signals to the waveguiding channels under the stripe windows 18, 19, different configurations of optical output from the laser 1 can be achieved. The two contacts, 12, 12' and 13, 13', associated with each stripe window 18, 19 are effectively a signal stripe contact with a discontinuity. It is thought that diffractive transverse coupling at the discontinuity allows the use of a shorter device than in known directional switches. With feedback, the switch operates as a memory device. The switch finds particular application in optical communications, for instance in signal routing.

16 Claims, 11 Drawing Sheets

DISCONTINUITIES WITH
PLOTS $i_1 + i_2 = 220 \rightarrow 240$ mA

FIG.9a
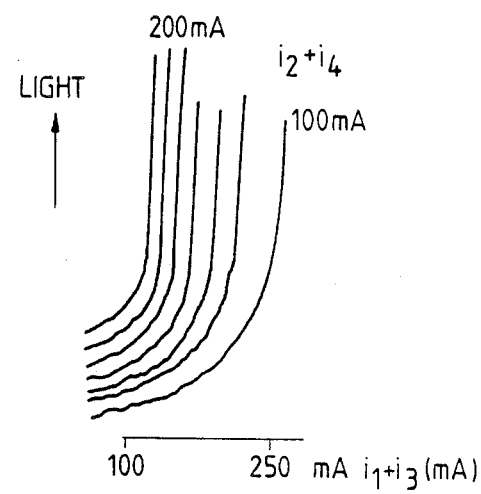
FIG.9c
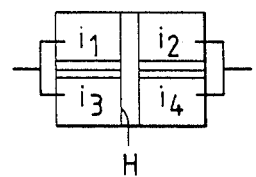
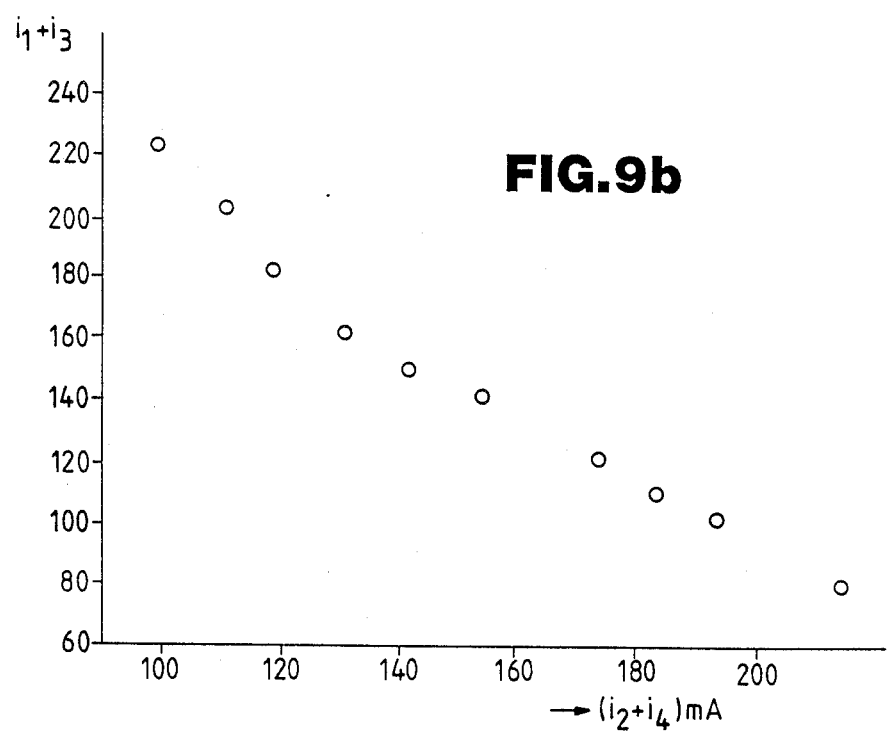
FIG.9b

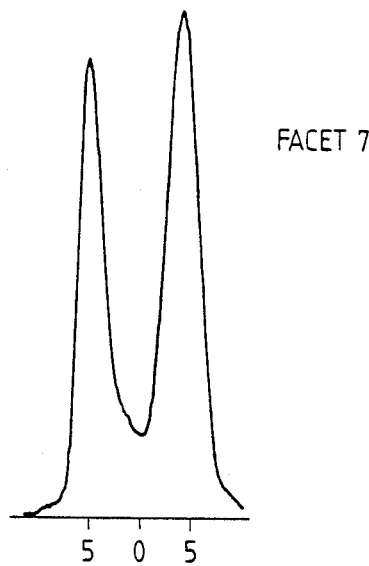
FIG. 10a
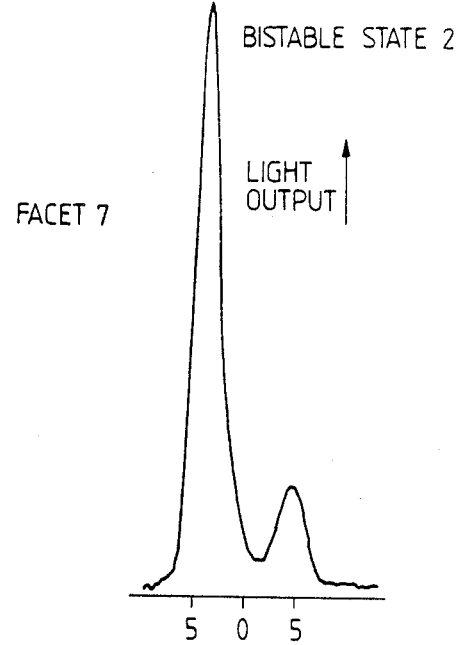
FIG. 10b
FIG. 10e
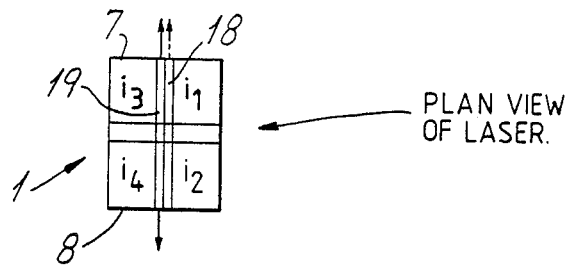
PLAN VIEW OF LASER.
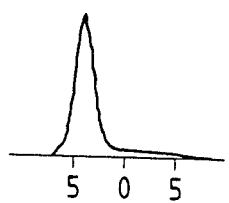
POSITION ALONG THE LASER JUNCTION (μm)
FIG. 10c
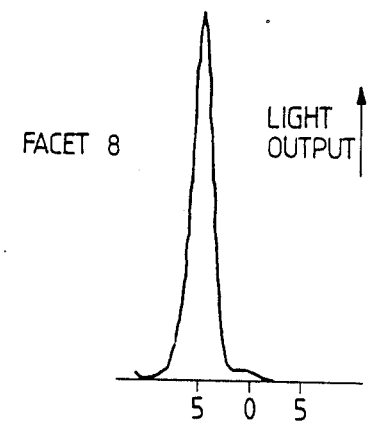
POSITION ALONG THE LASER JUNCTION (μm)
FIG. 10d

FIG.11a3
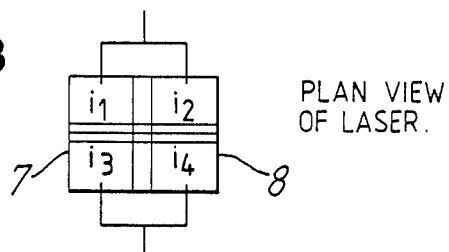
PLAN VIEW OF LASER.
FIG.11a1
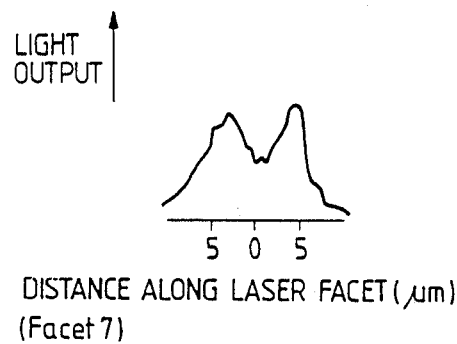
DISTANCE ALONG LASER FACET (μm)
(Facet 7)
FIG.11a2
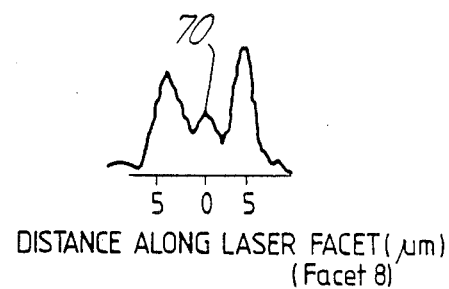
DISTANCE ALONG LASER FACET (μm)
(Facet 8)
FIG.11b3
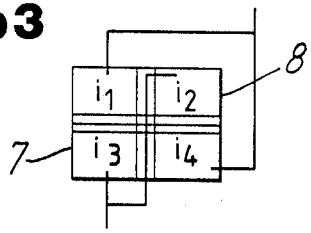
FIG.11b1
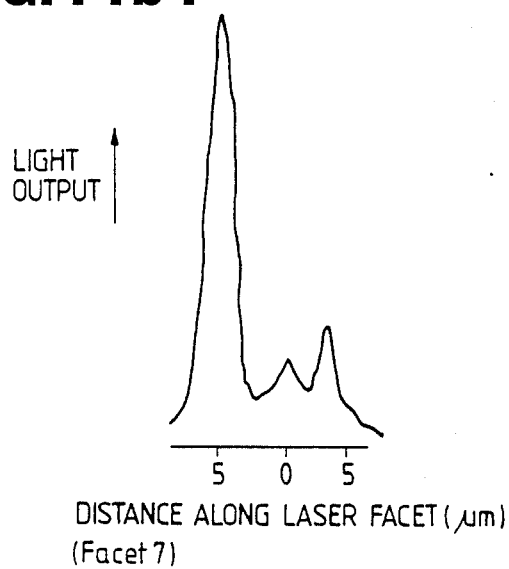
DISTANCE ALONG LASER FACET (μm)
(Facet 7)
FIG.11b2
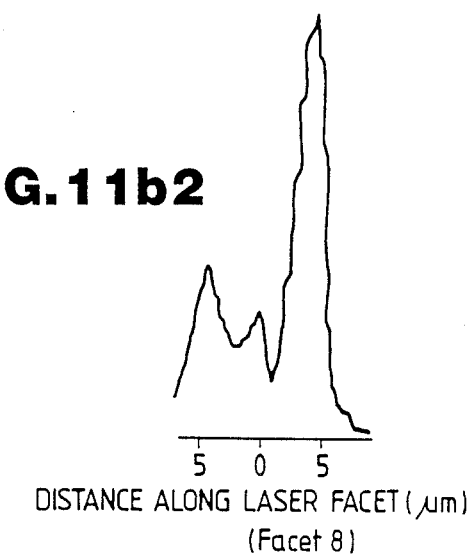
DISTANCE ALONG LASER FACET (μm)
(Facet 8)

FIG.11c3
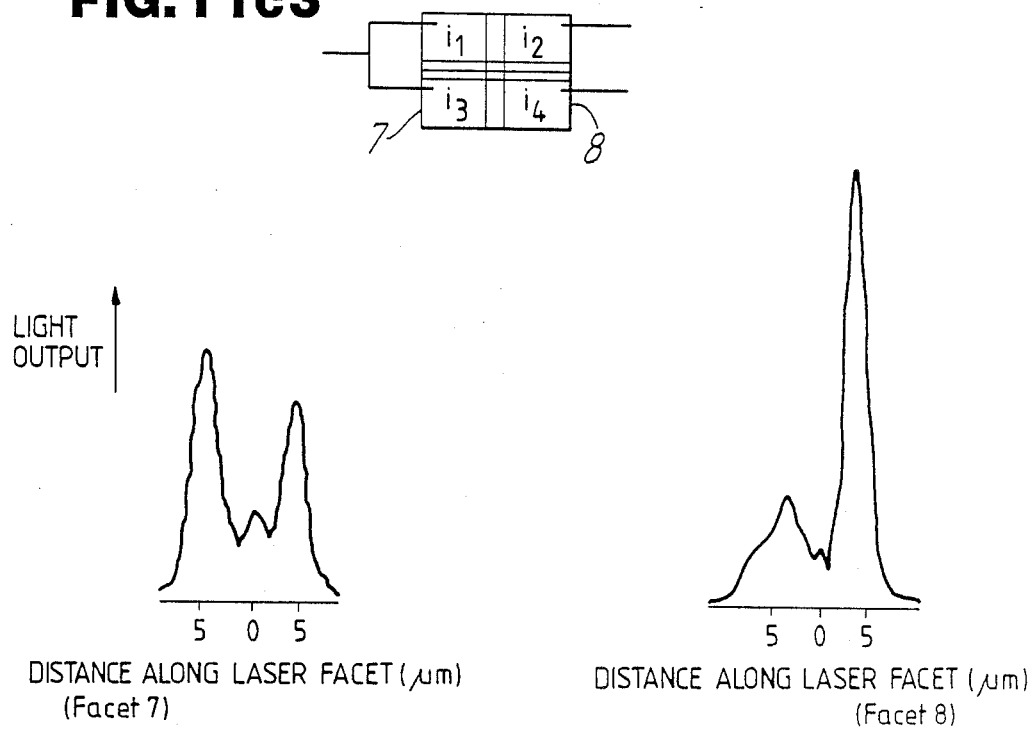
FIG.11c1
DISTANCE ALONG LASER FACET (μm)
(Facet 7)
FIG.11c2
DISTANCE ALONG LASER FACET (μm)
(Facet 8)
FIG.11d3
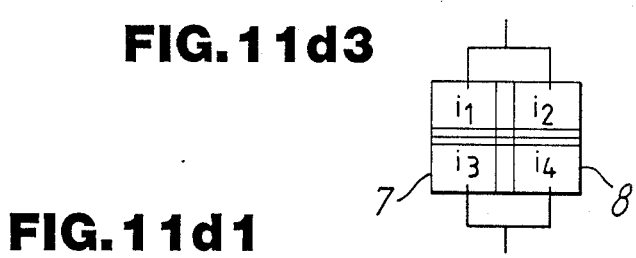
FIG.11d1
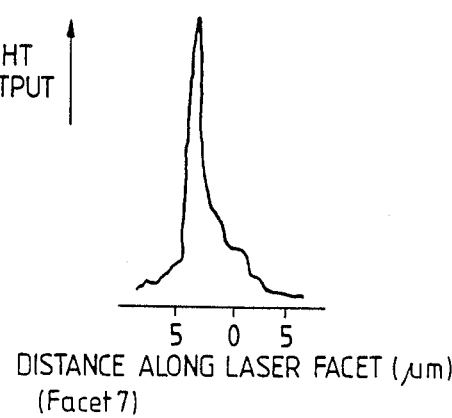
DISTANCE ALONG LASER FACET (μm)
(Facet 7)
FIG.11d2
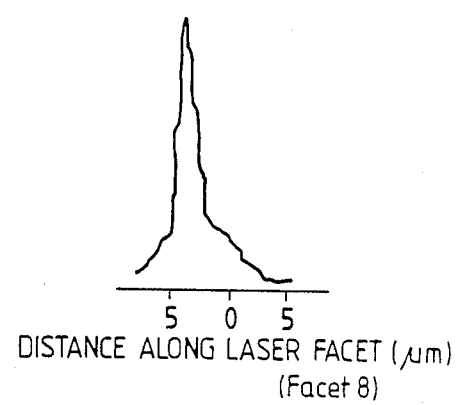
DISTANCE ALONG LASER FACET (μm)
(Facet 8)

OPTO-ELECTRONIC DIRECTIONAL SWITCH

FIELD OF THE INVENTION

The present invention relates to opto-electronic switches. It finds particular application in the field of optical communications, in switching or controlling the path of optical signals in a communication system.

The radiation used in optical communications is not necessarily in the visible region and the words "optical" and "light" when used in this specification are not to be interpreted as implying any such limitation. For example, longer wavelengths are preferred for transmission through silica optical fibres because the loss minima occur in such fibres in the infra-red region, at 1.3 $\mu$m and 1.55 $\mu$m approximately.

BACKGROUND AND SUMMARY OF THE INVENTION

Optical switches based on directional coupler devices are known in optical communications. They comprise in general two optical waveguides in close proximity. Optical radiation can be coupled out of one waveguide into the other by means of an evanescent field outside the waveguiding regions. This coupling only takes place over a particular coupling length however, which imposes a minimum device length, typically of the order of mm.

An optical switch may be passive. That is, it may not provide optical gain. However, it has been recognised that there are advantages in using an active device, a device which does provide optical gain, in a directional coupler. The use of an active device allows the optical power losses which inevitably occur in an optical communications system to be at least partially offset.

A known class of active device is that of semiconductor injection lasers which can be used to generate or to amplify an optical beam. A semiconductor injection laser structure comprises in general layers of materials on a substrate, and means for injecting electrical current to the layers, which together provide a longitudinal, waveguiding "active region".

A semiconductor junction is provided in the vicinity of the active region. When the injected current is passed through the layers, across the semiconductor junction, electrons and holes (carriers) combine in the active region to generate optical radiation. The optical radiation may be confined to the active region in a first direction by means of the relative refractive indices (index guiding) and band gaps of the layer materials, and in a second, perpendicular direction by means of the current distribution (gain guiding). The current is usually confined to a specific path by the use of a narrow, "stripe" electrical contact and, optionally, by changes in electrical conductivity of the layer materials in the second direction.

Optical confinement in the second direction may also, optionally, be provided by the distribution of refractive index and band gap of the layer materials by means of stepped interfaces between the layers.

The active region can be considered to be a waveguiding path. That is, a path along which radiation will be guided in use of the laser.

The threshold current at which the onset of "lasing" occurs depends on the degree of feedback into the structure, eg by reflections from its end faces, on the (current dependent) gain through stimulated emission as photons pass along the active region, and on other factors. At currents lower than the threshold current, the laser functions as a light emitting diode or as a superluminescent emitter and can be used to amplify an optical signal. At currents higher than the threshold current, the laser can also be used to amplify an optical input signal.

Another known class of active device is the travelling wave (TW) device. These have the same general structure as a laser but negligible feedback. For instance, the degree of feedback from a reflecting face in a TW device will generally be less than 0.1% and a device has been produced with feedback of the order of 0.01%. The characteristics of a TW device can be substantially different from those of a laser.

A laser (i.e. a non-TW device) generally shows feedback of at least 0.1% or 0.5% and commonly shows substantially greater feedback. If the feedback is provided by reflections at end facets the laser is known as a Fabry-Perot laser and, where the facets are uncoated, generally has a degree of feedback of at least 20%.

In the paper "Directional Coupler Switches With Optical Gain", IEEE Journal of Quantum Mechanics, QE-22(5) pp. 595-602 1986, by C. J. Setterlind and L. Thylen, an active directional coupler is described and theoretically analysed, which incorporates a TW device.

The TW structure described comprises a pair of buried rib waveguides arranged in parallel on a substrate. Each waveguide is provided, above the rib, with a narrow, ie stripe, metal contact and the exposed face of the substrate is metallised to provide a third contact. In one embodiment each stripe contact is in two segments, there being a gap halfway along its length. An optical beam may be input to either one of the waveguides.

By varying the relative currents supplied to the stripe contacts, and to the segments thereof, different distributions of optical radiation between the two waveguides can be achieved. In an ideal "cross state" all the light coupled into one waveguide exits from the other waveguide. In an ideal "bar state" all the light exits from the launch waveguide. Departures from these ideal states are referred to as "cross talk". (Cross talk tends to increase the levels of noise and power loss and is therefore undesirable.)

Although a degree of control over the distribution of light is shown, the TW structure suffers from the disadvantage that the extent to which one can achieve successful coupling from one waveguide to the other, with a low degree of cross talk is a function of the length of the structure and the structure described must necessarily be of the order of 2 mm long.

An object of the present invention is to provide an opto-electronic switch of small dimensions which shows useful performance characteristics.

According to the present invention there is provided an opto-electronic directional switch, comprising a semiconductor laser structure, wherein the laser structure comprises contacts for injecting current to provide at least two distinguishable optical waveguiding paths, the paths being neighbouring in a region where there is a discontinuity in each of the contacts associated with those paths, and control means for varying the characteristics of a first of the paths relative to a second of the paths such that the relationship between light output from the two paths can be changed.

It has been found that by using a laser structure of the above type an active switch can be fabricated which has a length which is an order of magnitude shorter than in known active switches, but which retains good operating characteristics. For instance, a good rejection ratio can be achieved for light output from one of the waveguiding paths compared in different operating modes of the switch. The level of cross talk is significantly less dependent on the length of the structure and it is possible to fabricate an active switch in which the level of cross talk is acceptably low for structure lengths which are an order of magnitude shorter than in known active directional switches.

The optical confinement of the waveguiding paths should be relatively tight. For instance at least 50%, and preferably at least 80%, of the optical radiation propagating in a path should be confined to lie under the associated contact. Typically contact widths will be of the order of 5 microns or less in a semiconductor switch according to an embodiment of the present invention. The confinement may be provided by means in addition to gain guiding provided by the contacts. For instance, index guiding may also be provided.

An additional advantage of the laser structure is that, as long as sufficient feedback is provided for instance using end facets of at least 1% reflectivity in a Fabry-Perot laser, switching can occur with a memory characteristic. That is the device can be switched from one switching state to another by the application of a control pulse which does not need to be maintained subsequently.

Either an electrical or an optical control pulse may be used. That is, the control means may comprise means to vary the relative levels of current injected along each of the paths, or to input an optical signal to at least one of the paths.

The configuration of the waveguiding paths where they are neighbouring in the region of the discontinuities, and of the associated contacts at the discontinuities, should be such that optical radiation propagating in one path can couple into the other path at the discontinuities by means of diffraction at the discontinuities. It is thought that it is because diffractive coupling occurs between the paths that the laser structure length can be so much shorter than in known active directional switches. By utilising coupling in such a manner, the design of the characteristics of the laser structure which determine the waveguiding paths can be relatively flexible. In particular, the paths can be made straight and parallel, optical radiation coupling across at the discontinuities. This is advantageous in fabrication technology and in design, for instance, of an array of several paths.

In an embodiment of the present invention, two parallel, neighbouring stripe contacts may be provided, each being divided into two segments by a discontinuity substantially halfway along its length.

BRIEF DESCRIPTION OF THE DRAWINGS

Embodiments of the present invention will now be described, by way of example only, with reference to the accompanying figures in which:

FIGS. 7a and 7b, 8a and 8b, 9a and 9b, 10a–10d, 11a1, 11a2, 11b1, 11b2, 11c1, 11c2, 11d1 and 11d2 to 11 show further experimental results;

Figure 1:
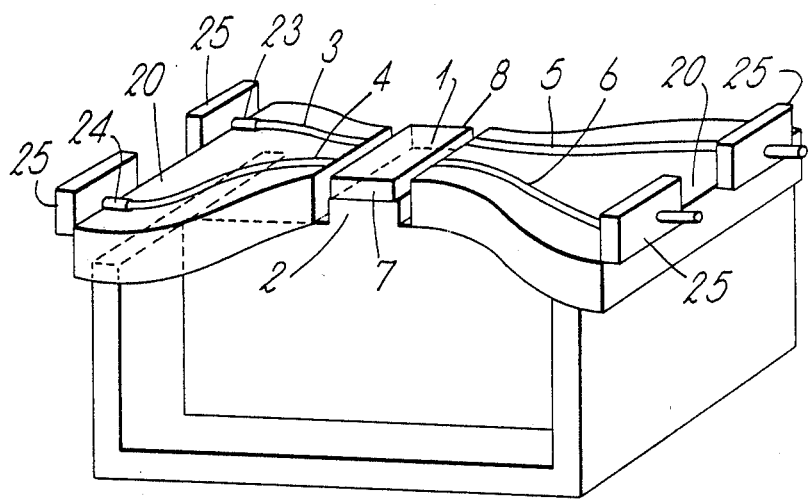
FIG. 1 shows a schematic three-quarter view of an opto-electronic switch according to the present invention.

Associated with FIGS. 5a, 7a, 8a, 9a, 10a, 11a1, 11b1, and 11c1 are schematic plan views shown in FIGS. 5b, 7c, 8c, 9c, 10e, 11a3, 11b3 and 11c3 of the switch of FIG. 1 to indicate relevant driving current arrangements.

DETAILED DESCRIPTION

Although terms such as "above" and "uppermost" are used in the present specification, they are used for convenience of description only and should not be taken to imply any necessary associated orientation unless the context indicates otherwise.

Referring to FIG. 1, a switch according to the present invention comprises a Fabry-Perot, semiconductor injection laser 1 mounted on a copper blade 2 between two pairs of current inputs 3, 4, 5, 6. Each end facet 7, 8 of the laser 1 is exposed.

Figure 2:
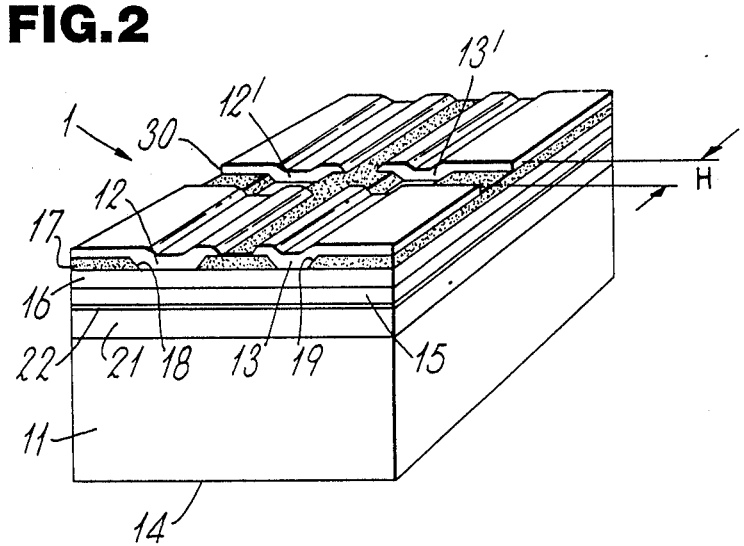
FIG. 2 shows a three-quarter view of a semiconductor injection laser for use in the switch of FIG. 1.
Figure 3:
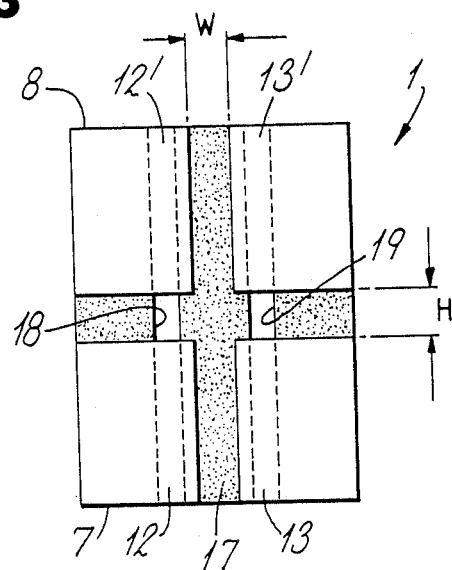
FIG. 3 shows a schematic plan view of the laser of FIG. 2.

Referring to FIGS. 1, 2 and 3, the laser 1 is based on a GaAs substrate 11 with a number of layers of semiconductor material grown epitaxially onto it. Four contacts 12, 12' and 13, 13' are provided to the uppermost surface of the top layer 16, making electrical contact to the top layer 16 through two stripe windows 18, 19 in an intervening dielectric layer 17.

The contacts 12, 12' and 13, 13' comprise a double metal layer extending over the whole top surface of the laser 1 except for a transverse gap H, across the width of the laser 1, and a longitudinal gap W, which extends the length of the laser 1, between the two stripe windows 18, 19 in the dielectric layer 17.

One of the current inputs 3, 4, 5, 6 only is connected to a corresponding one of each of the contacts 12, 12', 13, 13' which can then be driven independently of the other three contacts in each case. Each current input 3, 4, 5, 6 comprises a 1 mm wide copper conduction rail on a microstrip board 20, coupled to its respective contact by means of a gold wire and silver epoxy connection points (not shown).

In more detail, the structure and fabrication of the laser 1 are those conventional regarding a double heterostructure $Ga_{(1-x)}Al_xAs$ laser, x being 0.3.

The substrate 11 is 100 μm thick, comprises GaAs and is metallised on its lowermost face 14. Onto the substrate 11 are grown, by conventional epitaxial growth techniques, four layers: a 2 μm layer 21 of n-doped GaAlAs; a 0.2 μm active layer 22 of GaAs; a 0.8 μm p-doped layer 15 of GaAlAs; and a 0.8 μm p-doped contact layer 16 of GaAs. Each of the doped layers is doped to a conventional level for use in semiconductor laser technology. The active layer 22 lies between two layers 21, 15 of higher band gap and lower refractive index material to give both optical and carrier confinement in a direction normal to the layers.

Onto the contact layer 16 is deposited the dielectric layer 17 of $SiO_2$. Two stripe windows 18, 19 are etched through the $SiO_2$ down to the level of the contact layer 16. Zn is diffused into the contact layer 16 in the region of the stripe windows 18, 19 to give doping levels of the order of $3 \times 10^{17}$ cm$^{-3}$. A double metal layer of 3 $\mu$m of Au on 60 Angstroms of Ti is deposited on the dielectric layer 17 and into the stripe windows 18, 19, then etched to form the four contacts 12, 12', 13, 13' by forming the transverse and longitudinal gaps H and W. Although both the Ti and the Au layers are etched to form the transverse gap H, only the Au layer is etched to form the longitudinal gap W.

The laser 1 is 400 $\mu$m long, between its end facets 7, 8, and 200 $\mu$m wide, while each stripe window 18, 19 is 4 $\mu$m wide. The distance between the mid-lines of the stripe windows 18, 19 is 7 $\mu$m. The transverse gap H is 15 $\mu$m wide. The resistance measured between each pair of contacts in a direction across the width of the laser 1 is about 60 ohms while that measured in a direction along the laser 1, traversing the transverse gap H, is about 900 ohms.

To use the laser 1 as an opto-electronic switch it is mounted as shown in FIG. 1, each current input 3, 4, 5, 6 being connected via a 50 ohm chip resistor 23, 24 (only two shown) to an OSSM connector 25. Bias currents can be fed independently to each of the contacts 12, 12', 13, 13' and trigger pulses can be superimposed on the bias current of any one or more of the contacts. The laser 1 can be used either to generate optical radiation by lasing or to amplify an optical input signal.

Figure 4A:
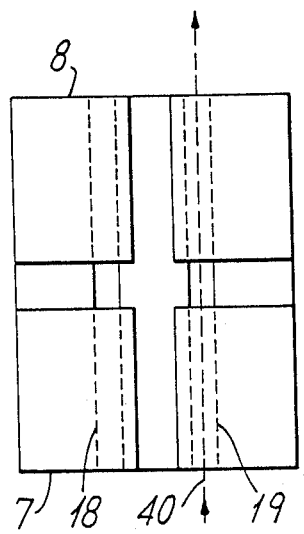
FIGS. 4a & 4b show different operating modes of the laser of FIG. 2.
Figure 4B:
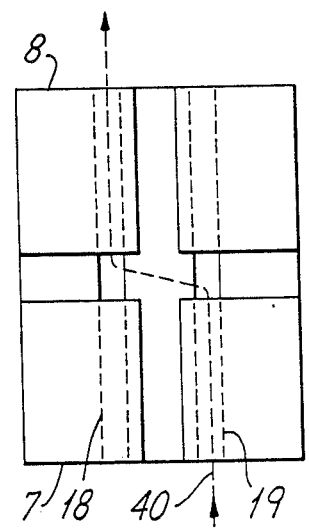

Referring to FIGS. 2, 4a and 4b, in use, the semiconductor injection laser 1 can be considered as providing two optical channels, each channel lying below one of the stripe windows 18, 19. It can lase or amplify in two or more different stable modes, light being carried in different distributions between the optical channels.

For instance, light *generated* by the laser 1 may be confined to one optical channel or distributed between both. Alternatively, light *input* 40 to one of the channels may be carried and emitted from that channel, the switch being in a bar state as shown in FIG. 4a, or it may be coupled into and emitted from the other channel, the switch being in a cross state as shown in FIG. 4b, or it may propagate in the channels in a combination of cross and bar states.

Referring to FIGS. 5a and 5b and FIGS. 6a and 6b, in an experiment using light generated by the laser 1, the light output from one end facet 8 of the laser 1 was measured, the contacts 12, 12', 13, 13' being driven in diagonal pairs.

The current to each contact 12, 12', 13, 13' was designated $i_1$, $i_2$, $i_3$ and $i_4$ respectively. The currents $i_2$ and $i_3$ to one diagonal pair of contacts 12', 13 were selected, at a fixed level, such that $i_2 + i_3 = 180$ mA and $i_2 = 1.1 \, i_3$. Variable currents $i_1$ and $i_4$ were fed to the other diagonal pair of contacts 12, 13', these currents being maintained equal to each other.

Because the Laser 1 is mounted with the p-doped layers uppermost, current pulses of 300 ns were used to avoid over-heating.

Figure 5A:
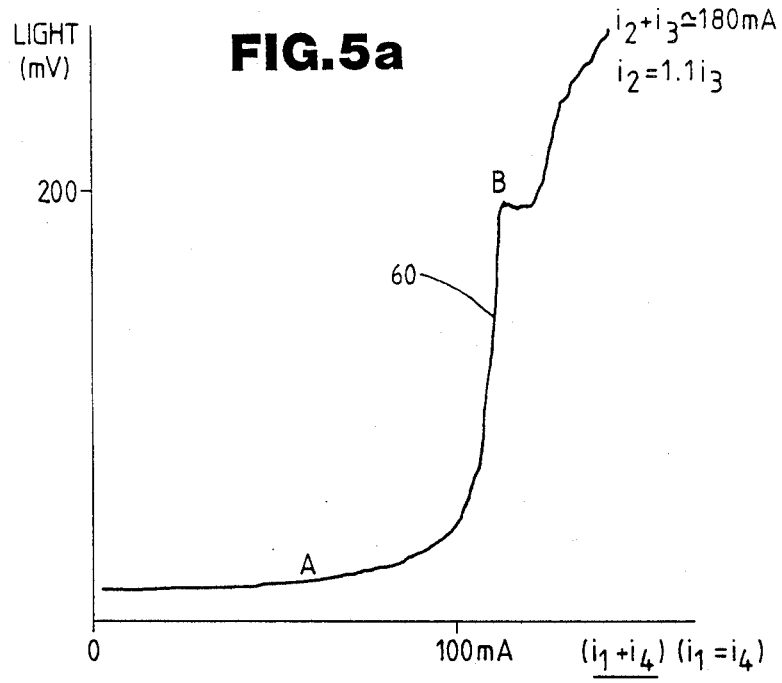
FIG. 5a shows a plot of light output, from the laser of FIG. 2, against drive current for diagonally driven contacts.
Figure 5B:
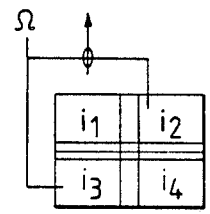

Referring to FIGS. 5a and 5b, the total light output from one end facet of the laser 1 was measured in mV using a photodetector. As the variable currents $i_1$ and $i_4$ were increased from zero, the light output remained substantially constant, increasing only a little, before showing a discontinuity and sharp increase 60 when the sum of $i_1$ and $i_4$ equalled slightly more than 100 mA.

Figure 6A:
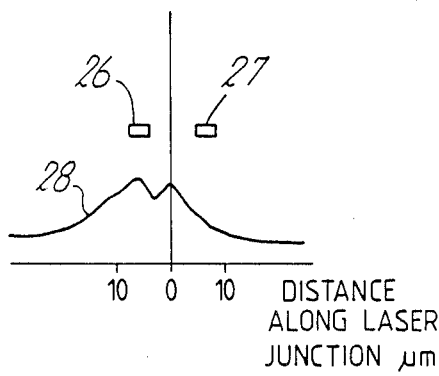
FIGS. 6a & 6b show the near field distribution of the light output of FIG. 5b under selected conditions.
Figure 6B:
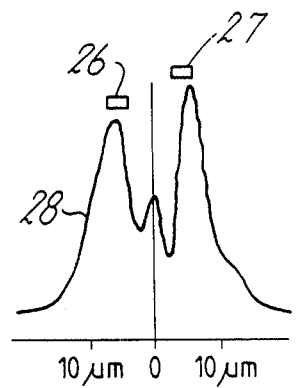

Referring to FIGS. 6a and 6b, the light output distribution 28 across the end facet 8 of the laser 1, in a direction passing across the axes of both optical channels, was measured for two values, A, B of the variable currents $i_1$ and $i_4$. The two values A, B lay either side of the sharp increase 60 in light output seen in FIG. 5b. The positions 26, 27 of the stripe windows 18, 19 and therefore of the two optical channels, in relation to the light output distribution 28 were also recorded.

It could be seen that the discontinuity in light output corresponded to a change in mode of the laser 1. At $i_1 + i_4 = A$, the laser 1 emitted spontaneous light substantially from under the position 26 of only one stripe window 18. At $i_1 + i_4 = B$, the laser 1 was lasing, emitting light from under the positions 26, 27 of both stripe windows 18, 19. Hence the laser 1 had switched from a first mode, in which light was generated in and emitted from only one optical channel, to a second mode, in which light was generated and emitted from both optical channels.

Figure 7C:
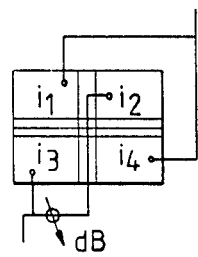
Figure 7A:
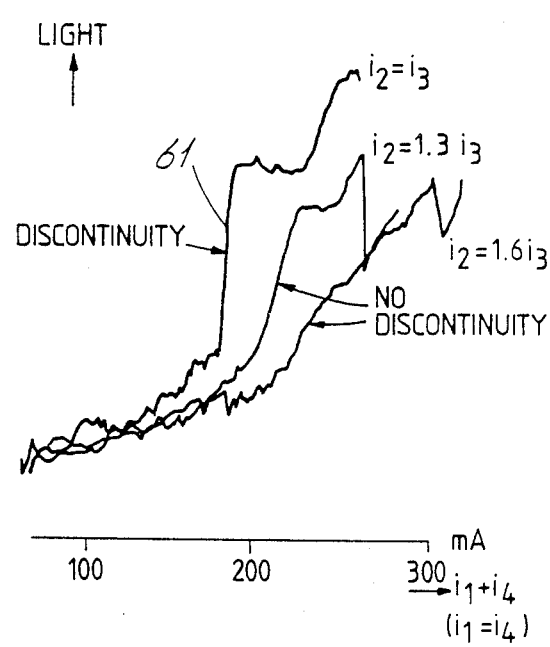
Figure 8A:
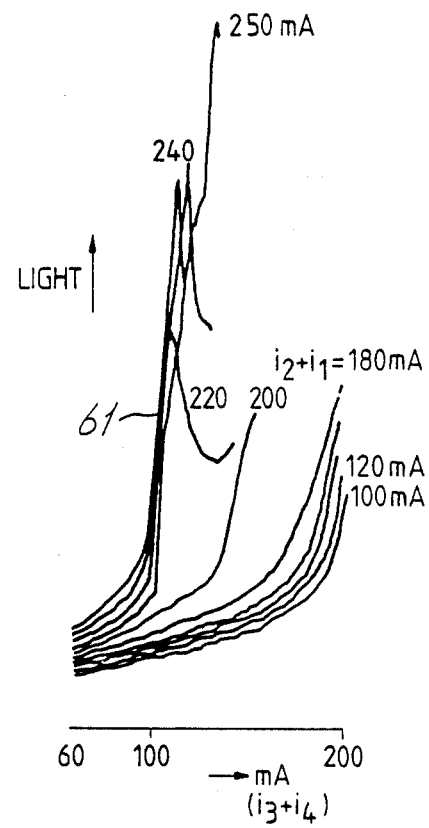
Figure 8C:
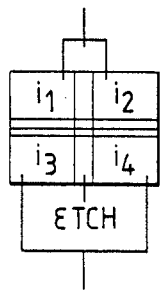

Taking a discontinuity in the total light output of the laser 1 as an indication of a change in mode, further experiments were done, taking different combinations of the contacts 12, 12', 13, 13' and varying the associated drive currents $i_1$, $i_2$, $i_3$, $i_4$. Referring to FIGS. 7a and 8a, discontinuities 61 were observed under the following conditions:

i. Diagonally associated contacts driven together (FIG. 7c)
 $i_2 = i_3$ fixed; $i_1 = i_4$, increasing
ii. "Side" contacts driven together (FIG. 8c)
 $i_1 = i_2$ fixed; $i_3 = i_4$, increasing
 $i_1 + i_2 =$ from 220 mA to 240 mA.

Referring to FIGS. 9a and 9c discontinuities were not observed under the following conditions:

iii. "End" contacts driven together
 $i_2 = i_4$ fixed; $i_1 = i_3$, increasing.

Figure 7B:
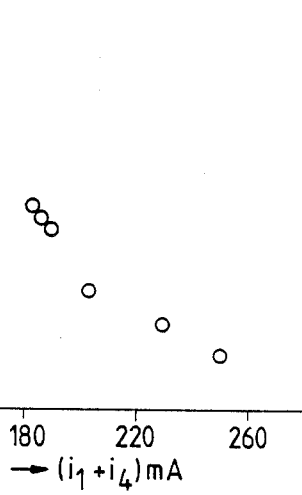
Figure 8B:
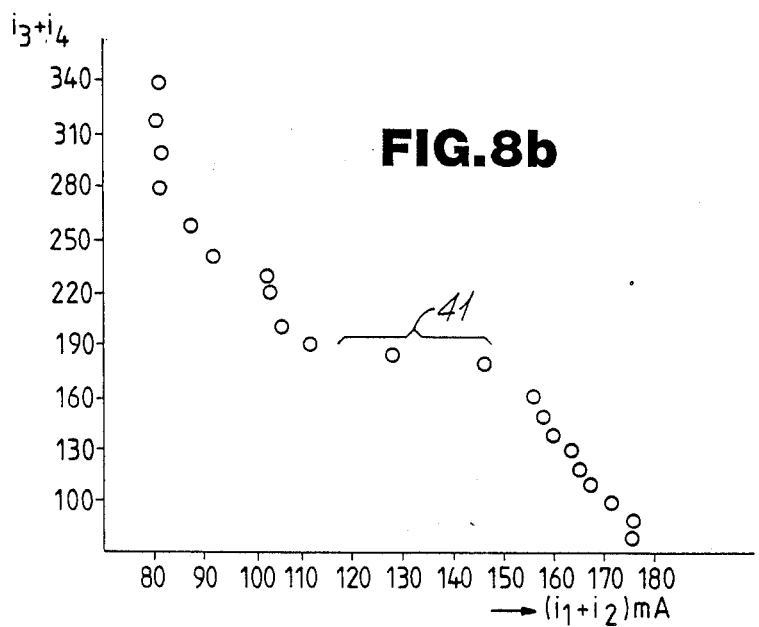

Referring to FIGS. 7b, 8b and 9b plots were made of the values of the drive currents to the associated pairs of contacts in cases i. to iii. above at which the onset of lasing was observed. Where no discontinuities were present, for instance in case iii. above, a substantially linear plot was obtained (FIG. 9b). Where discontinuities were present, for instance in case ii. above, the plot showed a plateau 41 which could be associated with the discontinuities (FIG. 8b).

Referring to FIGS. 10a through 10e, in a further demonstration of the operation of the laser 1, the optical output across each facet 7, 8 was plotted for each of two bistable states. Constant bias currents were supplied to the contacts and incremental electrical pulses of 10 n secs temporal width and 20 mA amplitude were superimposed alternately on the bias currents of two of the contacts 12 and 13. The constant bias currents supplied were, referring to the plan view of the laser 1 in FIG. 10e, $i_1 = 180$ mA, $i_2 = 89$ mA, $i_3 = 100$ mA, and $i_4 = 180$ mA. The laser 1 switched between the two output configurations shown in FIG. 10e with switching times of less than 10 n secs. However, the switching times were likely to have been affected by the input risetime (15 n secs) of the electrical trigger pulse.

When collecting the output light signal solely from the right hand stripe window 18, at the upper of the laser facets 7 as shown in the plan view of the laser 1 in the Figure, the on/off ratio between the two bistable states was as large as 8:1.

Instead of electrical switching, optical switching could be used in the above configuration, by replacing the electrical pulses with optical pulses, input to the ends of the waveguiding paths under the contacts. Using optical radiation of a wavelength corresponding to that of radiation generated by the laser 1, focused onto different input positions of the laser facet, switching behaviour as described above with respect to 10 ns electrical pulses can be achieved.

Referring to FIGS. 11a1–11a3, 11b1–11b3, 11c1–11c3, 11d1–11d3, near field measurements were carried out to plot the optical output across each facet 7, 8 of the laser 1 when driven to operate in different (lasing) modes. Referring to FIG. 11a3, where similar drive currents were supplied to each of the four contacts, predominantly twin-peaked near fields were observed at each facet 7, 8. A small interstripe peak 70 was also observed at one facet, resulting from interference between the curved wavefronts of the optical radiation emerging at the facet concerned.

Referring to FIG. 11b3, where a diagonal pair of contacts was driven preferentially, cross coupling was observed, optical output occurring under the diagonal pair of contacts.

Referring to FIG. 11c3, three out of four of the contacts were driven preferentially. As expected, optical output occurred predominantly from under each of the preferentially driven contacts.

Referring to FIG. 11d3, where both contacts relating to one of the stripe windows were driven preferentially, straight through coupling occurred with optical output being observed at either end of that stripe window.

(In FIGS. 11a1, a2; 11b1, 11b2, 11c1, 11c2, 11d1 and 11d2, each optical output plot is plotted in the same transverse direction with respect to the laser 1).

The total driving current supplied to the contacts in order to achieve the modes shown in FIGS. 11a1–a3, 11b1–b3, 11c1–c3 and 11d1–d3 was compared as a measure of the effective absorption in the laser 1 in each case. The threshold current for the bar state of FIG. 11d was 175 mA while those for the cross-coupled mode of FIG. 11b and for the divided mode of FIG. 11c were 399 mA and 360 mA respectively. This indicated increases in the effective absorption of 28% (22 cm$^{-1}$) and 6% (4.5 cm$^{-1}$) respectively.

In the above description, examples are mainly given of using changes in drive currents to the different contacts 12, 12′, 13, 13′ to operate the switch. In an alternative arrangement, the drive currents $i_1$, $i_2$, $i_3$, $i_4$ may remain constant, at a level below any lasing threshold of the laser, and an optical input signal used to operate the switch.

Referring to FIGS. 1 and 2, in an optically switched arrangement, an optical input signal may be injected into a first optical channel of the laser 1 at an end facet 7. The signal should be of a wavelength suitable for amplification by the laser 1. By applying an optical trigger pulse to one of the channels, the optical input signal may then be selectively switched to emerge from either of the optical channels at the other end of facet 8 of the laser 1.

Alternatively, the contacts could again be driven at a current below any lasing threshold of the laser 1, and an optical input signal injected into a channel of the laser 1, but the optical trigger pulse could be replaced by an electrical trigger pulse to one or more of the contacts, superimposed on the driving current concerned.

The present invention is directed to switching optical signals between alternative optical channels in a laser and should not be considered to be limited to switching between only two channels. For instance, there may be present a matrix of at least three optical channels between which an optical signal may be switched.

Figure 12:
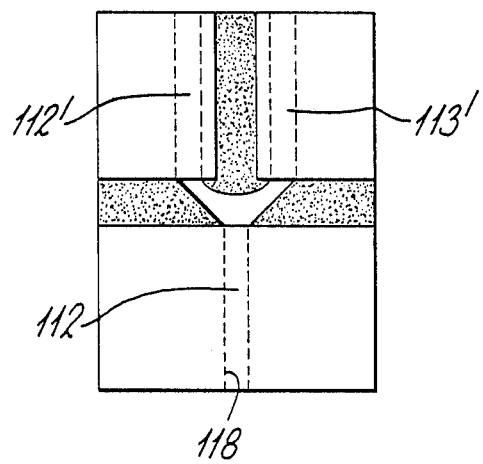
FIG. 12 shows a laser for use in an alternative embodiment of the present invention.

Further, two optical channels may share a common section. For instance, referring to FIG. 12, a forked stripe window 118 may be provided which has three associated contacts 112, 112′, 113′. Two optical channels are then available which both incorporate one of the contacts 112, but which then diverge to follow each of the remaining contacts 112′ 113′ respectively. Such a switch could be controlled by means of electrical trigger pulses supplied to the remaining contacts 112′, 113′.

The laser 1 of the embodiment described generates optical radiation of wavelength 0.8 μm but lasers which will generate or amplify different wavelengths may be substituted. Further, lasers of different structures, for instance having different contact arrangements, semiconductor materials or layer arrangements may be substituted.

It is not necessary that the transverse gap H should extend only through the Au/Ti contact material. It may also extend into the layers of semiconductor material. For instance opposing facets may be etched or ion milled into the semiconductor material. Under these circumstances, dielectric material could be used to fill the transverse gap H.

The transverse gap H need not be uniformly parallel sided but may provide different distances between the pairs of contacts it separates along the laser 1. That is, between the segments of each optical channel. However the width of the transverse gap H between each of these pairs of contacts is preferably limited. The unpumped region of the switch produced by the gap H introduces absorption in the laser cavity. If the absorption is too high, absorptive bistability can occur, particularly where higher feedback is used, which reduces the speed of operation of the switch. To avoid the onset of significant absorptive effects in a Fabry-Perot laser structure having facets of reflectivity of the order of 20%, it has been calculated that in a laser structure 400 microns long, the gap H should preferably be less than or equal to 40 microns. The onset of absorptive effects was found to depend on the ratio of currents, for instance, $i_2$:$i_1$, supplied to the contacts either side of the gap H in one of the stripe windows 18, 19. At large values of the width of gap H, the ratio had to be kept small, for instance, of the order of 1:1. However, at smaller values, for instance, 25 microns or 15 microns, the ratio $i_2$:$i_1$, could be increased. A second constraint on the width of gap H is that it should be more than or equal to the distance between the mid-lines of the stripe windows 18, 19 in the region of the gap H. This constraint is dictated by the requirement that optical coupling between the two different optical channels by diffraction is facilitated.

The above relationships between the width of the gap H and the length of the laser structure can be generalised as ratios generally applicable to laser structures of other lengths.

Where an optical trigger pulse is used, it need only be of a wavelength having sufficient photon energy to generate charge carriers in or near the optical channel to which it is input. These charge carriers then effect switching by changing the feedback characteristics, the optical gain, or the refractive index.

The characteristics determining the optical channels may be varied. For instance refractive index guiding may be provided in a direction perpendicular to the direction of current flow. Further, the channels need not be straight. However the distance between the optical channels in the region of a discontinuity in the associated contacts, that is the distance between the longitudinal axes of the channels, should not be so great as to prevent diffractive coupling of radiation from one channel to the other. The latter distance is typically required to lie in the range from 2 $\mu$m to 10 $\mu$m inclusive but might be found satisfactory above that range where tight control over refractive index variations in the semiconductor materials is available.

Figure 13:
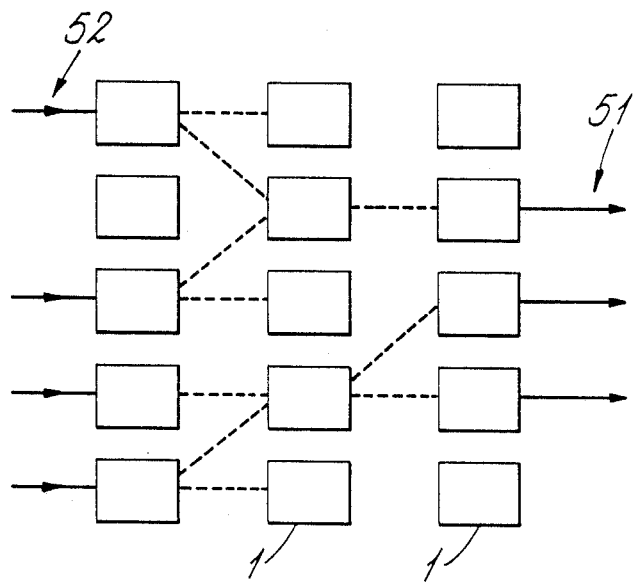
FIG. 13 shows a matrix switch incorporating switches according to the present invention.

Referring to FIG. 13, the switch of the present invention may act not just as an isolated switch but as part of a variable beam splitter or matrix switch. For instance an array of lasers 1 might be joined to act in a matrix with light output 51 from the matrix being controlled by the pattern of light input 52 as well as by the associated pattern of drive currents to the electrical contacts (not shown).

Figure 14:
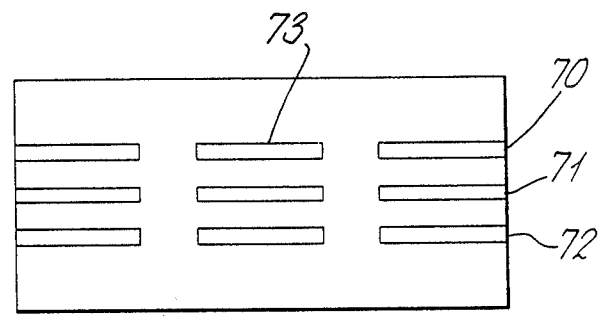
FIG. 14 shows a schematic plan view of the effective contact array for an alternative embodiment of the present invention.

In an alternative embodiment, instead of only four contacts being provided, three or more stripe windows 70, 71, 72 might be provided on a single laser structure, each being provided with more than two contacts. Referring to FIG. 14, an example of such an extended device may have nine contacts 73, some of which may optionally be coupled together and some of which may optionally not require a driving current at all, depending on the application to which such a device is to be put.

Figure 15:
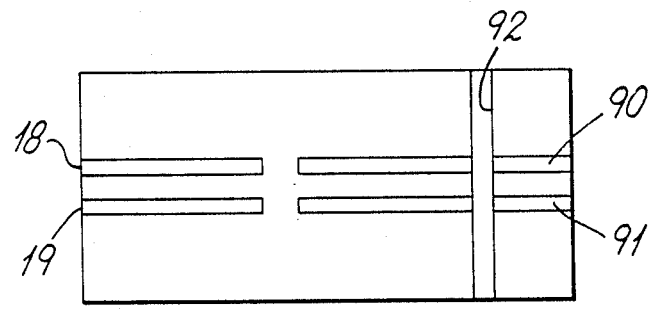
FIG. 15 shows a schematic plan view, including the effective contact array, of a switch as shown in FIG. 1 modified to provide beam steering at an output of the switch.

Referring to FIG. 15, in a further alternative embodiment, two extra contacts 90, 91 are provided after provision of a facet trench 92 in the optical channels provided by the stripe windows 18, 19. Such a facet trench 92 can be produced by wet chemical etching for instance. In a recent publication in the Journal of Quantum Electronics, QE 21 pp 658-662, M. Wade et al describe facet etching techniques. By applying current to the two extra contacts 90, 91, it is possible to change the electron density and hence the effective permeativity in the semiconductor material, to achieve a beam steering effect at the device output, according to known principles.

The facet trench 92 extends through the contact material into the layer above the active layer of the device and can be produced using known etchants for the relevant material of the layers.

Devices according to embodiments of the present invention can be used to switch input optical signals, even when driven over the lasing threshold, since the signals appear, amplified, superimposed on the light generated by the laser structure.

We claim:

1. An opto-electronic switch, comprising a semiconductor injection laser structure capable of providing the optical gain in at least two distinguishable and separate waveguiding paths, each waveguide path being at least partially defined by two or more electrodes between adjacent ones of which there is a discontinuities, the two waveguide paths being neighboring in a region of their respective electrode discontinuity, and switching control means for varying the characteristics of a first of the paths relative to a second of the paths such that the relationship between light outputs from the two paths can be changed.

2. A switch according to claim 1, wherein the configuration of the waveguiding paths where they are neighboring in the region of the discontinuities, and of the associated contacts at the discontinuities, is such that optical radiation propagating in one path can couple into the other path by means of diffraction at the discontinuities.

3. A switch according to either one of claim 1 or 2, wherein the laser structure is provided with sufficient optical feedback substantially to exclude travelling wave operation.

4. A switch according to any one of claim 1 or 2, wherein the switching control means comprises means to vary the relative levels of current injected along each of the waveguiding paths.

5. A switch according to any one of claim 1 or 2, wherein the switching control means comprises means to input an optical signal to at least one of the waveguiding paths.

6. A switch according to any one of the preceding claim 1 or 2, wherein the contacts comprise parallel, neighboring stripe contacts.

7. A switch according to any one of claim 1 or 2 wherein the laser structure is used to generate optical radiation in at least one of the waveguiding paths.

8. A switch according to any one of the preceding claim 1 or 2, wherein the laser structure is used to amplify an optical signal input to at least one of the paths.

9. A switch according to any one of the preceding claim 1 or 2, wherein the laser structure is a Fabry-Perot laser structure.

10. A switch according to any one of the preceding claim 1 or 2, wherein there is further provided a discontinuity in each of the paths adjacent the discontinuity in its respective contact.

11. A switch according to claim 10 wherein the discontinuity in each of the paths comprises a pair of facets in the semiconductor materials of the laser structure.

12. A matrix switch incorporating a switch according to any one of the preceding claim 1 or 2.

13. A memory device comprising an opto-electronic switch having a semiconductor injection laser structure capable of providing optical gain in at least two distinguishable and separate waveguiding paths, each waveguiding path being defined at least partially by two or more electrodes between adjacent ones of which there is a discontinuity, the two waveguide paths being neighboring in the region of their respective electrode discontinuities, and memory state control means for controllably varying the characteristics of a first of the paths relative to a second of the paths such that the relationship between the light outputs from the paths can be changed, whereby the memory device may be controllably switched from one switching state to another.

14. A memory device according to claim 13, wherein said memory state control means includes means for varying the relative levels of current injected along each of said waveguiding paths.

15. A memory device according to claim 13, wherein the configuration of the waveguiding paths where they are neighboring in the region of the discontinuities, and of the associated contacts at the discontinuities, is such that optical radiation propagating in one path can couple into the other path by means of diffraction at the discontinuities.

16. A memory device according to claim 13, wherein said memory device comprises a matrix array of said opto-electronic switches.

* * * * *